US008811095B2

(12) United States Patent
Tsern et al.

(10) Patent No.: US 8,811,095 B2
(45) Date of Patent: Aug. 19, 2014

(54) METHODS AND CIRCUITS FOR DYNAMICALLY SCALING DRAM POWER AND PERFORMANCE

(75) Inventors: Ely Tsern, Los Altos, CA (US); Thomas Vogelsang, Mountain View, CA (US); Craig Hampel, Los Altos, CA (US); Scott C. Best, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/578,864

(22) PCT Filed: Dec. 1, 2010

(86) PCT No.: PCT/US2010/058555
§ 371 (c)(1),
(2), (4) Date: Aug. 14, 2012

(87) PCT Pub. No.: WO2011/106056
PCT Pub. Date: Sep. 1, 2011

(65) Prior Publication Data
US 2012/0327726 A1      Dec. 27, 2012

Related U.S. Application Data

(60) Provisional application No. 61/307,431, filed on Feb. 23, 2010.

(51) Int. Cl.
*G11C 7/00*        (2006.01)
(52) U.S. Cl.
USPC ................................ 365/189.11; 365/189.15
(58) Field of Classification Search
USPC ........................................ 365/189.11, 189.15
See application file for complete search history.

(56) References Cited

U.S. PATENT DOCUMENTS

| 5,734,914 A * | 3/1998 | Nakamura et al. ............ 713/300 |
| 6,037,813 A | 3/2000 | Eto et al. |
| 7,071,757 B2 | 7/2006 | Bonaccio et al. ............. 327/295 |
| 7,102,935 B2 | 9/2006 | Miki et al. ............... 365/189.09 |

(Continued)

FOREIGN PATENT DOCUMENTS

| JP | 2000-057785 | 2/2000 | ............. G11C 16/02 |
| WO | 2007/127678 | 11/2007 | |
| WO | WO 2008-109341 | 9/2008 | ............... G05F 1/45 |
| WO | 2009-070409 | 6/2009 | ............... H04B 1/16 |

OTHER PUBLICATIONS

Ta, Paul D. et al., "A Low Power Clock Distribution Scheme for Complex IC System", ASIC Conference and Exhibit, 1991. Proceedings, Fourth Annual IEEE International Rochester, NY, USA Sep. 23-27, 1991, New York, NY, USA, IEEE, US Sep. 23, 1991, pp. P1-5/1, XP010048471.

(Continued)

*Primary Examiner* — Huan Hoang
(74) *Attorney, Agent, or Firm* — Silicon Edge Law Group LLP; Arthur J. Behiel

(57) ABSTRACT

A memory system supports high-performance and low-power modes. The memory system includes a memory core and a core interface. The memory core employs core supply voltages that remain the same in both modes. Supply voltages and signaling rates for the core interface may be scaled down to save power. Level shifters between the memory core and core interface level shift signals as needed to accommodate the signaling voltages used by the core interface in the different modes.

29 Claims, 12 Drawing Sheets

(56) References Cited

U.S. PATENT DOCUMENTS

| | | | |
|---|---|---|---|
| 7,155,617 B2 | 12/2006 | Gary et al. | 713/300 |
| 7,251,183 B2 | 7/2007 | Itoh et al. | 365/227 |
| 7,463,096 B2 | 12/2008 | Chi et al. | 331/2 |
| 7,583,555 B2 | 9/2009 | Kang et al. | 365/226 |
| 7,605,609 B1 | 10/2009 | Andrews et al. | 326/68 |
| 2003/0080780 A1 | 5/2003 | Okamoto et al. | |
| 2008/0098254 A1 | 4/2008 | Altevogt et al. | 713/600 |
| 2008/0219076 A1 | 9/2008 | Cheng | |
| 2009/0016142 A1 | 1/2009 | Fujioka et al. | 365/227 |
| 2009/0037712 A1 | 2/2009 | Mallik et al. | 713/1 |
| 2009/0154257 A1 | 6/2009 | Fujioka et al. | |

OTHER PUBLICATIONS

Pangjun et al., "Low-Power Clock Distribution Using Multiple Voltages and Reduced Swings", IEEE transactions on very Large Scale Integration (VLSI) systems, IEEE Service Center, Piscataway, NV, US, vol. 10, No. 3, Jun. 1, 2002, XP011080536, ISSN: 1063-8210.
PCT Search Report and Written Opinion dated Aug. 5, 2011 re Int'l. Application No. PCT/US2010/058555. 11 Pages.
PCT Chapter II Demand transmitted Dec. 22, 2011 for International Application No. PCT/US10/058555. 7 pages.
Hynix Semiconductor, H5GQ1H24AFR, 1Gb (32M×32) GDDR5 SGRAM, Rev. 1.0, Nov. 2009, document is a general product description. 173 Pages.
Nakagome et al, "Review and Future Prospects of Low-Voltage RAM Circuits", IBM J. Res. & Dev. vol. 47, No. 5/6, Sep./Nov. 2003, pp. 525-552. 28 pages.
Huang, Gang et al., "Minimizing Energy-per-bit for On-board LC Transmission Lines", Proceedings of the IEEE 2005 International Interconnect Technology Conference, Jun. 6-8, 2005, pp. 77-79. 3 pages.
Hass, K.J. et al., "Level Shifting Interfaces for Low Voltage Logic," 9th NASA Symposium on VLSI Design, Albuquerque, New Mexico, Nov. 2000. pp. 3.1.1-3.1.7. 7 pages.
EP Office Action dated Nov. 29, 2013 in EP Application No. 10846798.6. 6 pages.
International Preliminary Report on Patentability (Chapter II) dated Jan. 18, 2013 in International Application No. PCT/US10/058555. 8 pages.
EP Response dated Apr. 7, 2014 in EP Application No. 10846798.6, Includes New Claims and New Description pp. 2 and 2a (Highlighted and Clear copies). 17 pages.

* cited by examiner

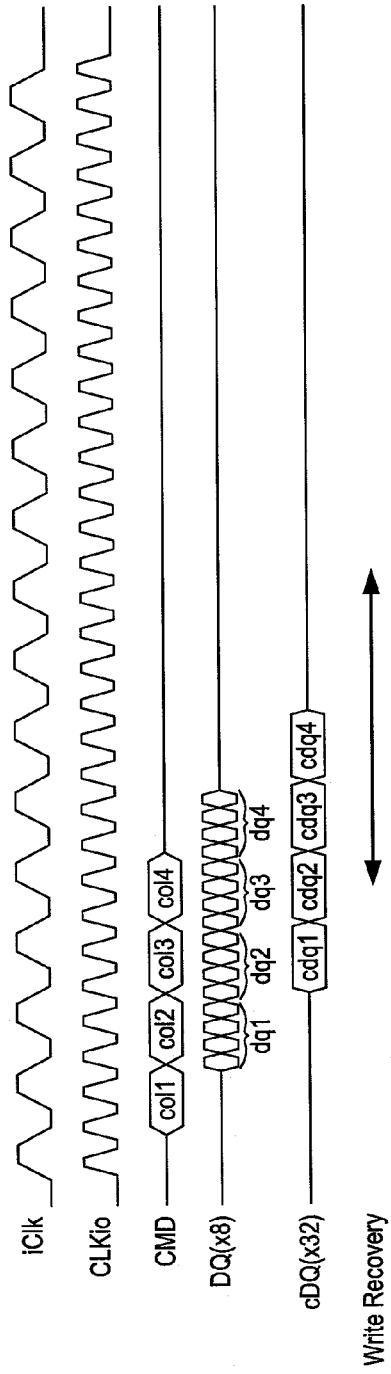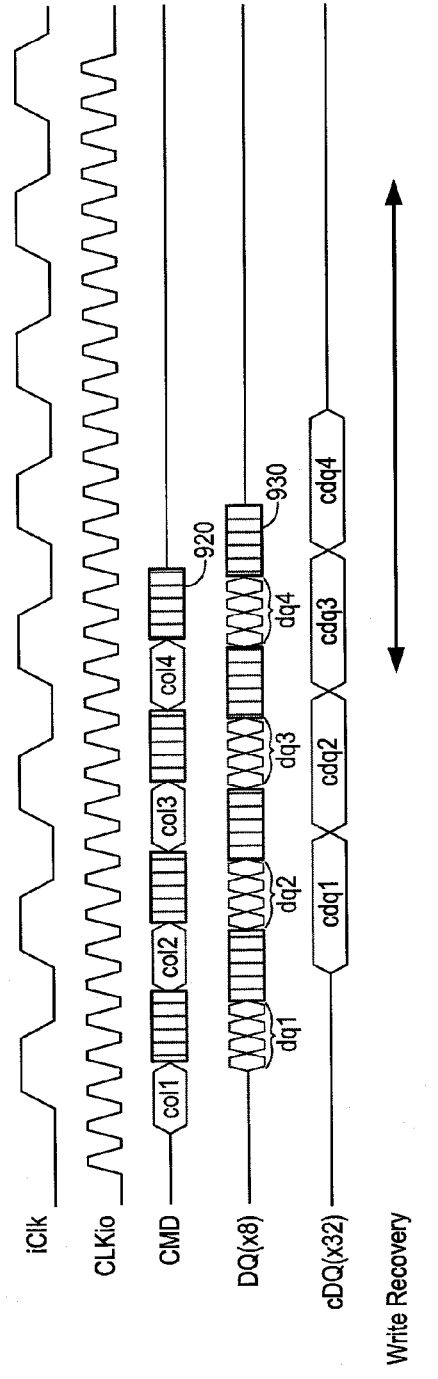

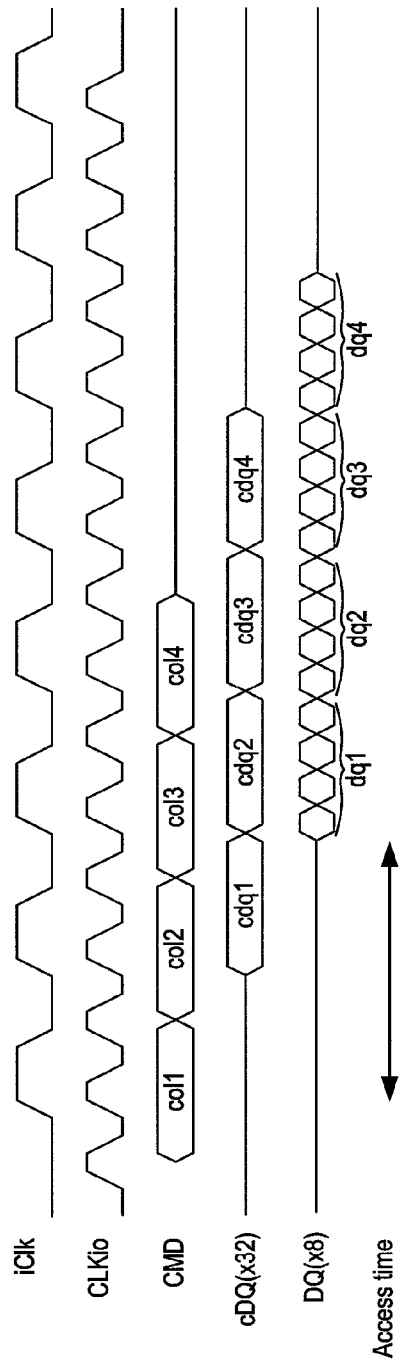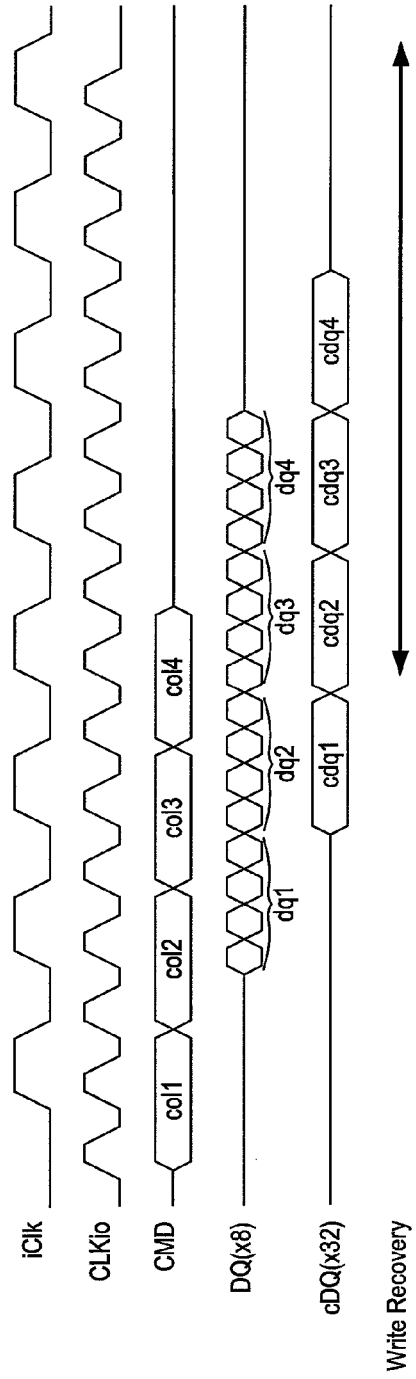

METHODS AND CIRCUITS FOR DYNAMICALLY SCALING DRAM POWER AND PERFORMANCE

FIELD

The subject matter disclosed herein relates generally to the field of computer memory, and more particularly to methods and circuits for dynamically adjusting speed performance and power usage.

BACKGROUND

The market for portable electronic devices, such as personal digital assistants (PDAs), mobile telephones, and portable computers, is increasing rapidly. This growth is due in large part to more powerful processors and expanded memory resources, both of which are required to support a proliferation of productive and entertaining applications. Unfortunately, performance enhancements tend to increase power consumption, a problem that is particularly troublesome for battery operated systems. Larger and extra batteries help, but are cumbersome and expensive. The demand for improved performance is therefore at odds with the demand for small, efficient, and inexpensive mobile devices.

Achieving peak performance in electronic devices generally requires relatively high supply voltages and data rates. Peak performance is not always required, however, in which case lower supply voltages and reduced data rates can be used to save power. For example, processing circuitry may recognize that a given task may be performed at a low data rate without interfering with the user's experience, and might therefore enter into a power-saving mode that employs a reduced supply voltage to convey data at a relatively low rate.

A number of techniques for regulating signaling rates and supply voltages have been implemented in mobile devices or proposed in the literature. Some such techniques, commonly known as Dynamic Voltage Scaling, control supply voltage according to performance requirements. Variations in computational or signaling-rate requirements can be exploited to reduce the average energy used by a device while maintaining an acceptable level of performance. Reducing the average energy relaxes battery requirements, allowing for longer life, smaller batteries, or both.

Processors are not alone in consuming undesirable levels of energy. Memory systems also consume energy, and the amount of energy consumed likewise increases with performance. However, dynamic voltage and frequency control has been difficult to implement in memory systems, particularly in dynamic random-access memory (DRAM) and Flash memory. This is because memory-cell voltages are hard to scale dynamically without severely impacting yield and latency. Furthermore, high-performance memory devices commonly use high-speed device interfaces that would suffer unacceptable latencies when voltage supplies are scaled. There is therefore a need for memories that support dynamic scaling of power and performance.

BRIEF DESCRIPTION OF THE DRAWINGS

The subject matter disclosed is illustrated by way of example, and not by way of limitation, in the figures of the accompanying drawings and in which like reference numerals refer to similar elements and in which:

FIG. 9A-9D are timing diagrams illustrating read and write timing for I/O interface 340 of FIGS. 3 and 5 in both the low-power and the high-performance modes.

FIGS. 11A and 11B illustrate the behavior of I/O and core interfaces for embodiments in which the clock speed and supply voltage Vio of the I/O interfaces are reduced in the low-power mode to accommodate the lower speed of the core interface.

DETAILED DESCRIPTION

Figure 1:
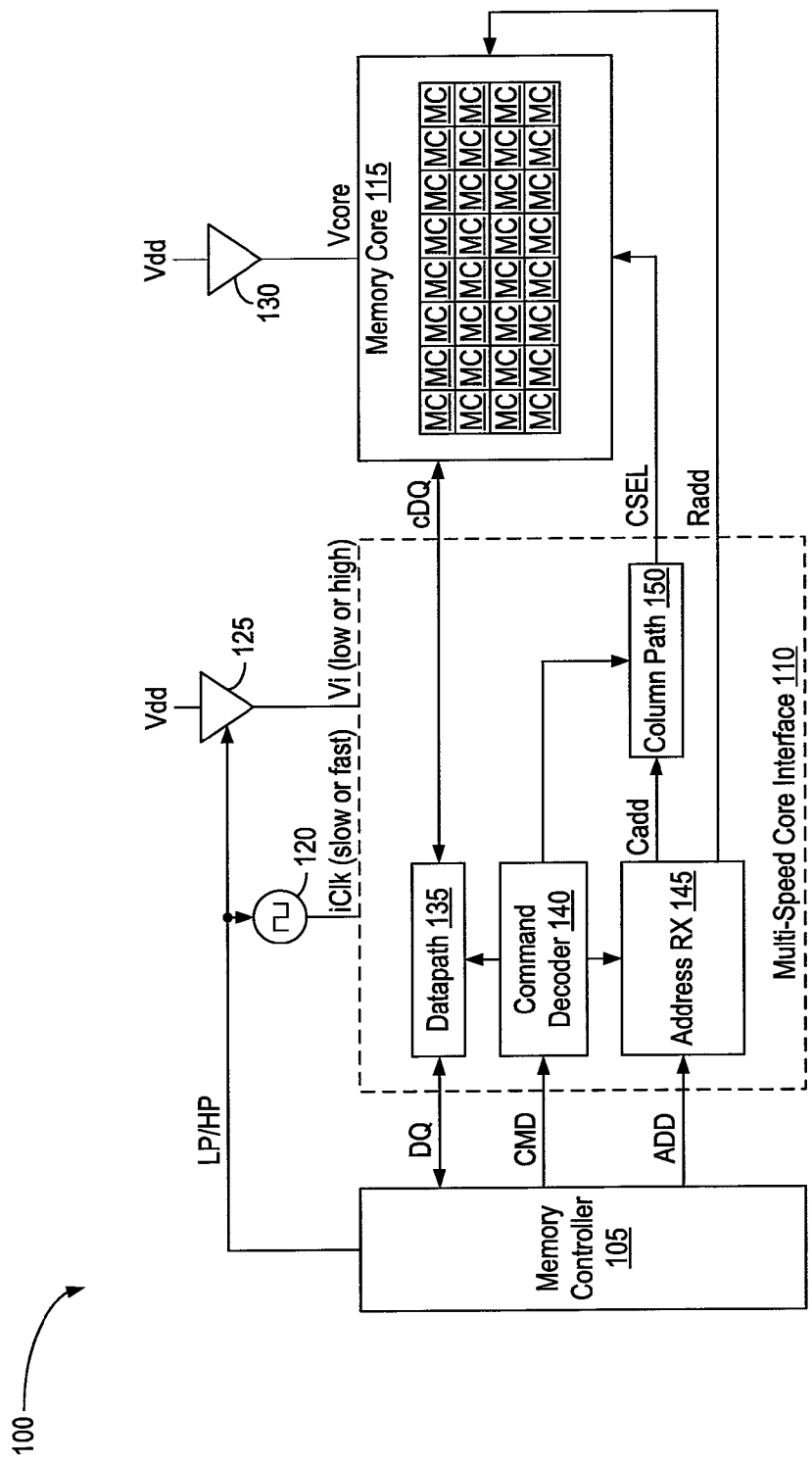
FIG. 1 depicts a memory apparatus 100 that supports low-power and high-performance modes in accordance with one embodiment.

FIG. 1 depicts a memory apparatus 100 that supports dynamic frequency and power scaling. More particularly, FIG. 1 presents a memory apparatus embodiment that performs this scaling on the basis of discrete modes. Memory apparatus 100 includes a memory controller 105, a multi-speed core interface 110, and a memory core 115. Memory controller 105 controls a clock source 120 and voltage regulator 125 to select between a low-power mode and a high-performance mode. In the low-power mode, clock source 120 provides a relatively low-frequency clock signal iClk and regulator 125 a relatively low supply voltage Vi to core interface 110. Core interface 110 then communicates data and address signals with core 115 at relatively slow and power-efficient rates. In the high-performance mode, clock source 120 provides a relatively high-frequency clock signal iClk and regulator 125 a relatively high supply voltage Vi to core interface 110. Core interface 110 then communicates the data, command, and address signals at relatively high rates, albeit with lower power efficiency. A second voltage regulator 130 delivers a constant set of core voltages Vcore to memory core 115 in both modes.

It should be appreciated that power consumption in interfaces, such as interface 110, is typically a function of both frequency and the square of the supply voltage. Thus, for example, an interface power savings of approximately fifty percent can be obtained by using a lower power voltage of approximately 71%, with additional savings based on a slower signaling rate. Speed in CMOS circuitry in particular is typically a function of supply voltage, so by scaling interface circuitry supply voltage, the system of FIG. 1 effectively permits interface circuitry to respond more slowly, in a manner consistent with a relatively the slower external signaling rate. Notably, while the embodiment of FIG. 1 is couched in terms of discrete modes, power and frequency may in other embodiments have many variations not associated with formally defined modes, e.g., with change occurring under programmatic control of a processor or similar circuitry (e.g., a memory controller). In part because of the dependence of power consumption on the square of voltage, however, discrete power savings modes may be appropriate for some implementations. For example, variation in supply voltage may be inconsistent with applied signaling rates (e.g., permitting the interface circuitry to respond too quickly or preventing it from responding quickly enough). To optimize savings, therefore, it may be desired to link interface supply voltage variations with specific signaling system transmission rates and to apply these in terms of formally-defined modes. FIG. 1, as mentioned, is such an embodiment, being based on the use of low-power and high-performance modes.

Memory core 115, dynamic random-access memory in this embodiment, includes an array of memory cells MC arranged in rows and columns. Memory controller 105 issues commands CMD and addresses ADD to memory core 115 via core interface 110 to read and write data DQ to and from specified subsets of memory cells MC in memory core 115. It should be appreciated that rows and columns may be of various sizes, depending on implementation; the embodiment of FIG. 1 is greatly simplified for ease of illustration. Practical memory apparatuses typically include a number of memory arrays, and each array includes far more cells than is shown here. Memory core 115 typically also includes part of the row and column decode and drive circuitry as well as part of the data drive and amplification circuitry.

The function of the core interface 110 is to store and retrieve data from the memory core 115 (typically for external processing) dependent on the address supplied by the memory controller. The core interface includes a datapath 135, a command decoder 140, an address receiver 145, and a column path 150. Command decoder 140 decodes commands CMD from controller 105 to develop control signals directing a number of conventional memory operations, read, write, activate and precharge operations being the most common. Read and write commands are accompanied by address signals ADD, which address receiver 145 decodes into separate column and row address signals Cadd and Radd. Column path 150 conveys the column address to memory core 115 via a collection of column-select lines CSEL, only one of which is shown. Memory core 115 includes a row decoder (FIG. 3) that decodes row addresses Radd to select from among the rows of memory cells MC. Datapath 135 communicates data DQ as core data cDQ, either away from core 115 for read operations or toward core 115 for write operations.

Memory apparatus 100 can support memory operations other than read and writes. In DRAM systems, for example, apparatus 100 can include support for e.g. refresh operations, test procedures, and error checking. Discussions of these and other conventional functions and features are omitted for ease of illustration.

As noted above, memory apparatus 100 supports both a low-power mode and a high-performance mode. In the low-power mode, controller 105 asserts a low-power/high-performance signal LP/HP that controls clock source 120 and voltage regulator 125. As a consequence, clock source 120 issues clock signal iClk at a relatively low frequency and voltage regulator sets voltage Vi to a low value. The low clock frequency and supply voltage reduce the signaling and processing rates for data, commands, and addresses, but also reduce power consumption within core interface 110.

In the high-performance mode, controller 105 de-asserts low-power/high-performance signal LP/HP, causing clock source 120 to issue clock signal iClk at a relatively high frequency and voltage regulator to set voltage Vi to a high value. In one embodiment, the frequency of clock signal iClk and supply voltage Vi are both doubled in the high-performance mode relative to their respective values in the low-power mode. Doubling the supply voltage quadruples power consumption but allows for doubling of processing and communication rates. The amount of energy per unit of information (energy per bit) in the high-performance mode is therefore approximately double that of the low-power mode. Other embodiments support additional power and performance modes, or support one or more ranges of power and performance settings rather than discrete modes.

Figure 2:
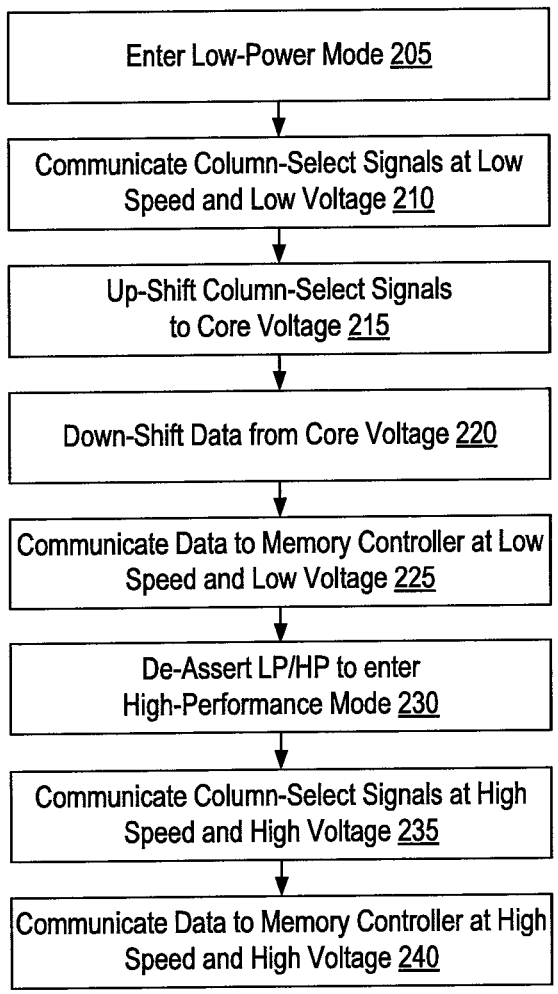
FIG. 2 is a flowchart depicting the operation of memory apparatus 100 of FIG. 1 in accordance with one embodiment.

FIG. 2 is a flowchart depicting the operation of memory apparatus 100 of FIG. 1 in accordance with one embodiment. Beginning at 205, memory apparatus 100 enters the low-power mode when memory controller 105 asserts signal LP/HP to clock source 120 and voltage regulator 125. The decision as to whether to enter the low-power mode can come from a microprocessor (not shown) running power-management software. All or a subset of the signals within core interface 110 propagate at the relatively low speed established by clock signal iClk in the low-power mode, and the signal swings of these signals are limited by interface voltage Vi. For example, address receiver 145 conveys column-address signals Cadd to column path 150, which directs column-select signals CSEL to memory core 115 at the relatively low rate and swing voltage (210). Datapath 135 similarly communicates row addresses Radd and data to core 115 at the relatively low rate and voltage. Command decoder 140 processes commands CMD to control datapath 135, address receiver 145, and column path 150.

The core voltage Vcore used to convey data, command, and address signals within core 115 is not scaled down in the low-power mode, and is higher than interface voltage Vi in the low-power mode. It should be noted in this regard that FIG. 1 therefore provides a system where two or more different supply voltages are provided to memory (e.g., to a memory device), the first supply voltage representing an unscaled voltage (Vdd/Vcore), and the second representing a selectively scaled voltage (Vi), which each drive different circuitry.

Once consequence of a design where a memory interface can be independently scaled is that the voltage swings of the signals from interface 110 can be low relative to what is required of core 115. Level shifters can therefore be provided (FIG. 3) to raise the signal swings of signals cDQ, CSEL, and Radd to the requisite core levels. For example, in 215, column-select signals CSEL are up-shifted from signal swings derived from voltage Vi to signal swings derived from the higher voltage Vcore. In one embodiment, rooted in discrete modes for example, voltage Vcore can be twice voltage Vi.

Assuming this memory access is to read data from a specified address in memory core 115, memory core 115 responds to column-select signals CSEL and row address Radd by producing the requested data to datapath 135 as core data cDQ. Moving from core 115 to interface 110, data signals cDQ are down shifted from core voltage Vcore to interface voltage Vi (220). Data signals cDQ thus propagate through datapath 135 at the relatively low data rate and voltage selected for power efficiency. Data DQ from datapath 135 is conveyed to memory controller 105 at the same low data rate (225). Write operations are similar, except that data DQ and cDQ move in the opposite direction to load data into memory core 115 at addresses specified by column-select and row-address signals CSEL and Radd.

Memory apparatus 100 can operate in the low-power mode until controller 105 receives an instruction to enter the high-performance mode. Responsive to such an instruction, memory controller 105 de-asserts signal LP/HP, which causes clock source 120 to double the frequency of interface clock signal iClk, and voltage regulator 125 to double interface voltage Vi (230).

In the high-performance mode, all or a subset of the signals within core interface 110 propagate at the relatively high speed established by clock signal iClk, and the voltage swings of these signals is increased by the relatively higher core-interface voltage Vi. For example, address receiver 145 conveys column-address signals Cadd to column path 150, which directs column-select signals CSEL to memory core 115 at the relatively high rate and voltage (235). Address receiver 145 and datapath 135 similarly communicate row addresses Radd and data cDQ to core 115 at the relatively high rate and voltage.

Core voltage Vcore is the same in the high-performance and low-power modes. In one embodiment, voltage Vcore is the same or similar to interface Vi in the high-performance mode. In such cases the level of the core-interface signals need not be shifted in either direction between interface 110 and core 115. Assuming a memory access is to read data from a specified address, memory core 115 responds to column-select signals CSEL and row address Radd by producing the requested data on interface cDQ for communication to memory controller 105 via datapath 135 (240). Write operations are similar, except that data DQ and cDQ move in the opposite direction to load data into memory core 115 at addresses specified by column-select and row-address signals CSEL and Radd.

Core voltage Vcore is illustrated as a single node and corresponding voltage for ease of illustration. A practical memory device can include more than one core voltage. DRAM memory devices, for example, typically include a variety of core voltages selected for optimal performance. These core voltages generally include the external supply voltage VCC, the internal voltage VINT, a boosted wordline voltage VPP, the bitline voltage VBL a half-bitline-voltage VBL/2 as a reference for the bitline sense-amplifiers, and a substrate voltage VBB. These voltages can be provided using voltage regulators integrated with the memory core on the same integrated-circuit device, or one or more core voltage may be provided from external sources. In the embodiment of FIG. 1, voltage regulator 130 represents a collection of regulators that develops these and other necessary or desired core voltages from an externally supplied voltage Vdd.

In the depicted example, the same interface voltage Vi is used throughout interface 110, a relatively high voltage in the high-performance mode and a relatively low voltage in the low-power mode. Interface voltage Vi can, however, represent a number of supply voltages, each tailored to optimize a particular function of interface 110. As discussed below in connection with FIG. 3, for example, changing the supply voltage for some types of input/output (I/O) circuitry can have significant adverse effects on performance. The supply voltages to such circuits can be held constant when switching between modes. Voltage regulator 125 and clock source 120 can be external to or integrated with interface 110 in the same integrated-circuit device. One or both of controller 105 and memory core 115 can likewise be integrated with interface 110. Other configurations are also possible.

Figure 3:
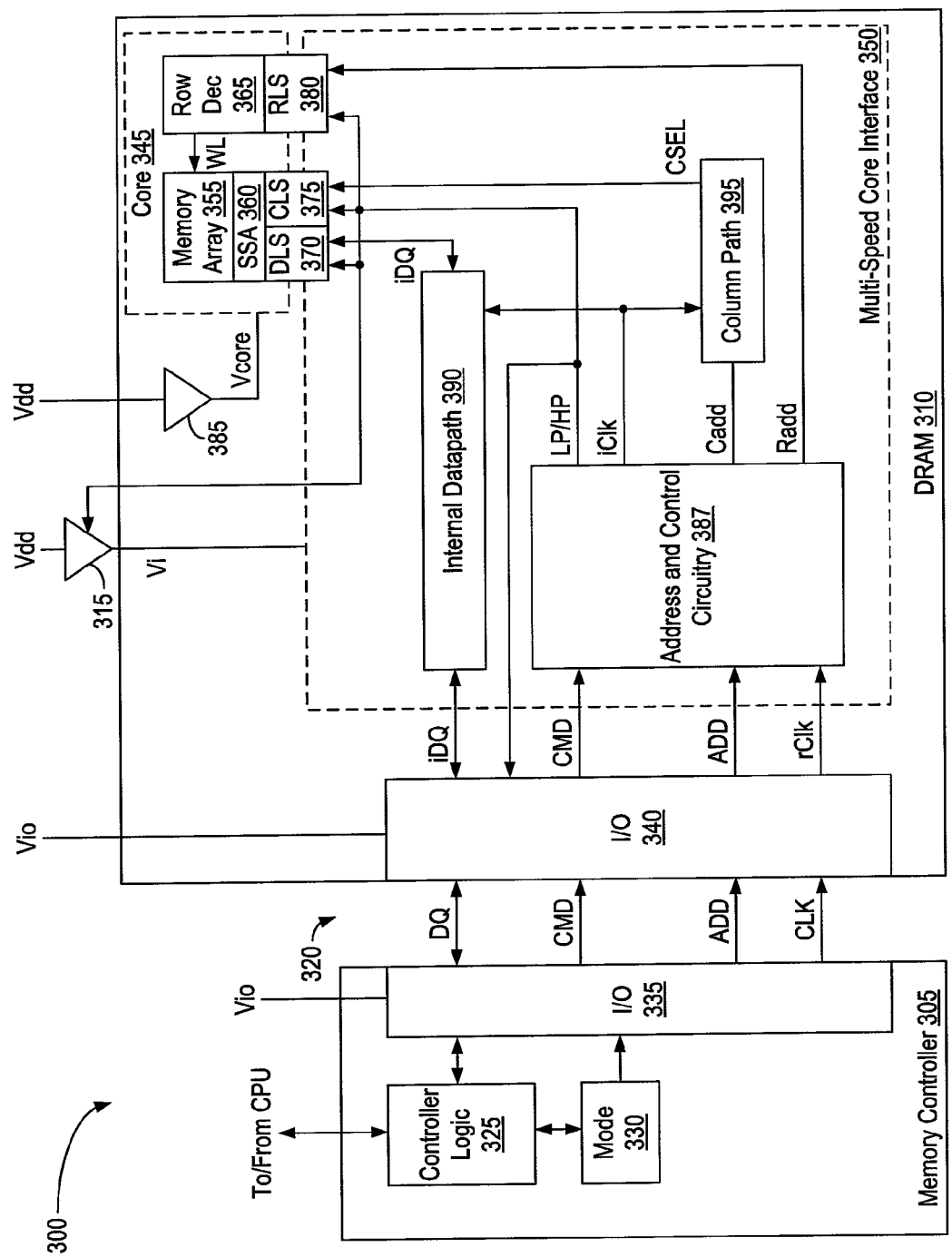
FIG. 3 depicts a memory system 300 in accordance with another embodiment.

FIG. 3 depicts a memory system 300 in accordance with another embodiment Memory system 300 includes a memory controller 305, a DRAM 310, and an external voltage regulator 315. A central-processing unit (CPU), not shown, issues requests to memory controller 305 to store and retrieve data from DRAM 310.

Memory controller 305 is a digital circuit that manages the flow of data going to and from DRAM 310. Memory controllers are typically separate from the DRAM, and may be implemented as a separate integrated circuit (IC) or integrated with another IC, such as a microprocessor. In the embodiment of FIG. 3, memory controller 305 and DRAM 310 are on separate ICs and communicate via a channel 320 that conveys data DQ, commands CMD, addresses ADD, and a reference clock signal CLK. These signals and the methods used to convey them are conventional, so a detailed discussion is omitted for brevity.

Memory controller 305 includes some control logic 325, a mode register 330, and an input/output (I/O) interface 335. A CPU on the same or a different IC issues requests to enter different modes. Loads mode into an MC register that controls how the I/O sends and receives data. Control logic 325 conventionally manages the flow of data with DRAM 310 responsive to commands from e.g. the CPU. In accordance with this embodiment, controller logic 325 loads mode register 330 with a value indicative of a performance mode for memory system 300. The data rate changes with performance, so mode register 330 communicates mode information to I/O interface 335 that allows the I/O interface to accommodate the different modes. In a low-power mode, for example, mode register 330 may instruct I/O interface 335 to reduce the frequency of clock signal CLK and the signaling rates of signals DQ, CMD, and ADD by a factor of two. Other embodiments adjust signaling bandwidth in different ways, a number of which are detailed below.

DRAM 310 includes an I/O interface 340 to communicate with I/O interface 335 of the memory controller, a memory core 345 to store and provide data, and a multi-speed core interface 350 to manage the flow of signals between I/O interface 340 and memory core 345. Memory core 345 conventionally includes a memory array 355, secondary sense amplifiers 360, and a row decoder 365. These elements are powered by an internal or external voltage regulator 385 that produces core voltage Vcore. As noted previously, core voltage Vcore can be a collection of core voltages tailored to the needs of different elements of core 345. The creation and application of core voltages is well known.

Data level shifters 370, column level shifters 375, and row level shifters 380 are disposed between core interface 350 and core 345 to accommodate changes to signaling voltages when transitioning between core interface 350 and core 345. The swing-voltage disparities can be considerable in the low-power mode when interface voltage Vi is reduced for improved efficiency. As in the example of FIG. 1, interface voltage Vi lowers and raises to support low-power and high-performance modes, while core voltage Vcore remains the same in both modes.

Core interface 350 includes address and control circuitry 387, and internal datapath 390, and a column path 395. Datapath 390 is "internal" to distinguish it from datapath DQ of channel 320, which is external to DRAM 310 in this example. Control circuitry 387 decodes commands CMD from controller 305 to perform of number of memory operations, such as reads and writes, and to switch core interface 350 and voltage regulator 315 between the low-power and high-performance modes. Memory operations are directed to specific addresses received on address bus ADD, and operations performed by core interface 350 are timed relative to a reference clock rClk received or derived from the clock signal CLK from memory controller 305. The reference clock can come from elsewhere in other embodiments.

Figure 4:
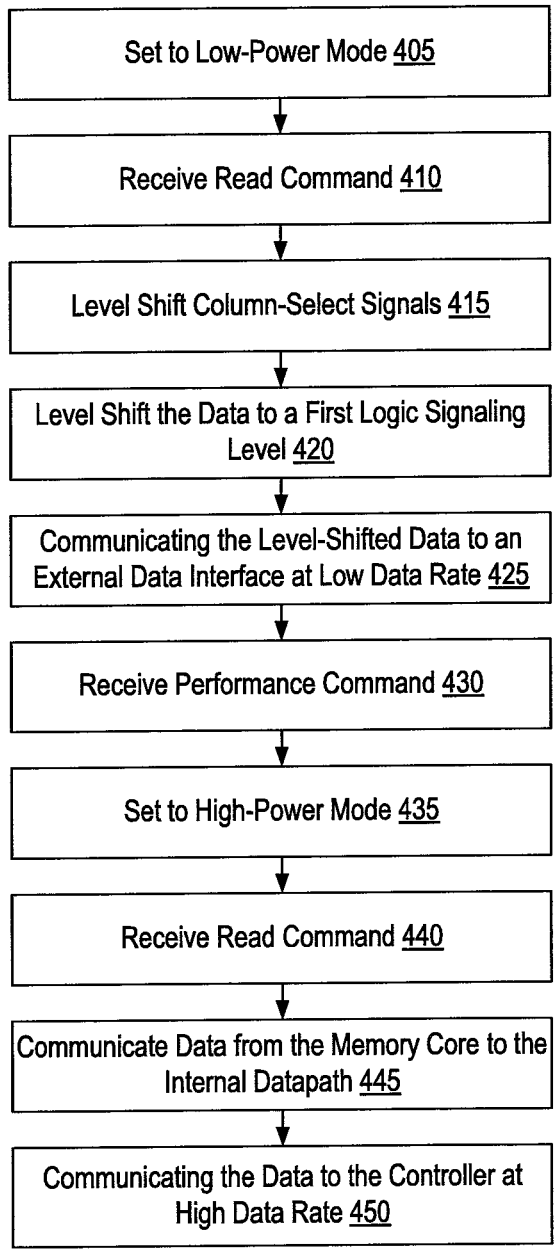
FIG. 4 is a flowchart 400 describing the operation of memory system 300 of FIG. 3.

FIG. 4 is a flowchart 400 describing the operation of memory system 300 of FIG. 3. Beginning at 405, and responsive to a command from e.g. the CPU, controller logic 325 issues a command to DRAM 310 that causes I/O interface 340 and core interface 350 to enter the low-power mode, and also causes mode register 330 to load value that places I/O interface 335 in a low-speed mode in anticipation of communicating with DRAM 310 at reduced signaling rates. On the DRAM side, control circuitry 387 asserts signal LP/HP such that regulator 315 produces a relatively low interface voltage Vi, level shifters 370, 375, and 380 prepare to accommodate the resulting voltage disparities between the interface and core voltages, and the DRAM I/O interface 340 enters the low-speed mode to match I/O interface 335 of controller 305. Control circuitry 387 also reduces the frequency of interface clock signal iClk to slow the signaling rate through interface 350.

Using the example of a read command from controller 305 (410) directed to a specified address ADD, address and control circuitry 387 converts address ADD into row and column addresses Radd and Cadd. Column path 395 converts column addresses Cadd into column-select signal CSEL, which are level shifted by level shifter 375 for application to memory core 345 (415). Row address signals are likewise level shifted, by row level shifter 380, and the level-shifted signals applied to row decoder 365. Row decoder 365 decodes the level-shifted row addresses Radd to select from among a plurality of wordlines WL to memory array 355.

Responsive to the level-shifted address signals and other control signals, not shown, sense amplifiers 360 sense the addressed row of memory cells and present a selected column of the sensed memory-cell contents to datapath 390 via data level shifter 370 (420). Internal datapath 390 then conveys the read data to I/O interface 340, and hence to controller 305, at the reduced data rate used in the low-power mode (425). Writes are performed similarly, with data iDQ being level shifted up via data-level shifter 370 to the core voltage Vcore for writing into memory array 355.

System 300 enters the high-performance mode when commanded to do so by e.g. an external controller (430). Controller logic 325 issues a command to DRAM 310, responsive to which control circuitry 387 de-asserts signal LP/HP, and loads mode register 330 with a value that prepares I/O interface 335 to receive data and communicate commands and addresses at increased rates. Both I/O interfaces 335 and 340 rely upon a supply voltage Vio that does not change between performance modes; in other embodiments, however, I/O interfaces 335 and 340 can use scaled supply voltages in the manner of interface 350.

Again using the example of a read command (440), address and control circuitry 387 converts received address signals ADD into row and column addresses Radd and Cadd. Column path 395 converts column addresses Cadd into column-select signal CSEL, which are applied to memory core 345 to extract that addressed data. In the embodiment of FIG. 3, the data and column-select signals in the core use the same voltage range as the signals CSEL and iDQ in the high-performance mode. The de-assertion of signal LP/HP in the high-power mode thus instructs Level shifters 370 and 375 not to level-shift those signals. One or both of the column-select and data signals may be level shifted in the high-performance mode in other embodiments. In either case, sense amplifiers 360 sense a selected row of memory cells and present the addressed column of the resultant sensed data to internal datapath 390 via level shifter 370 (445). Finally, this data is communicated to controller 305 via internal datapath 390 and external I/O interfaces 340 and 335 at the relatively high data rate of the high-performance mode (450). Write operations are similar, but the data is communicated from controller 305 to a specified address in core 345.

Figure 5:
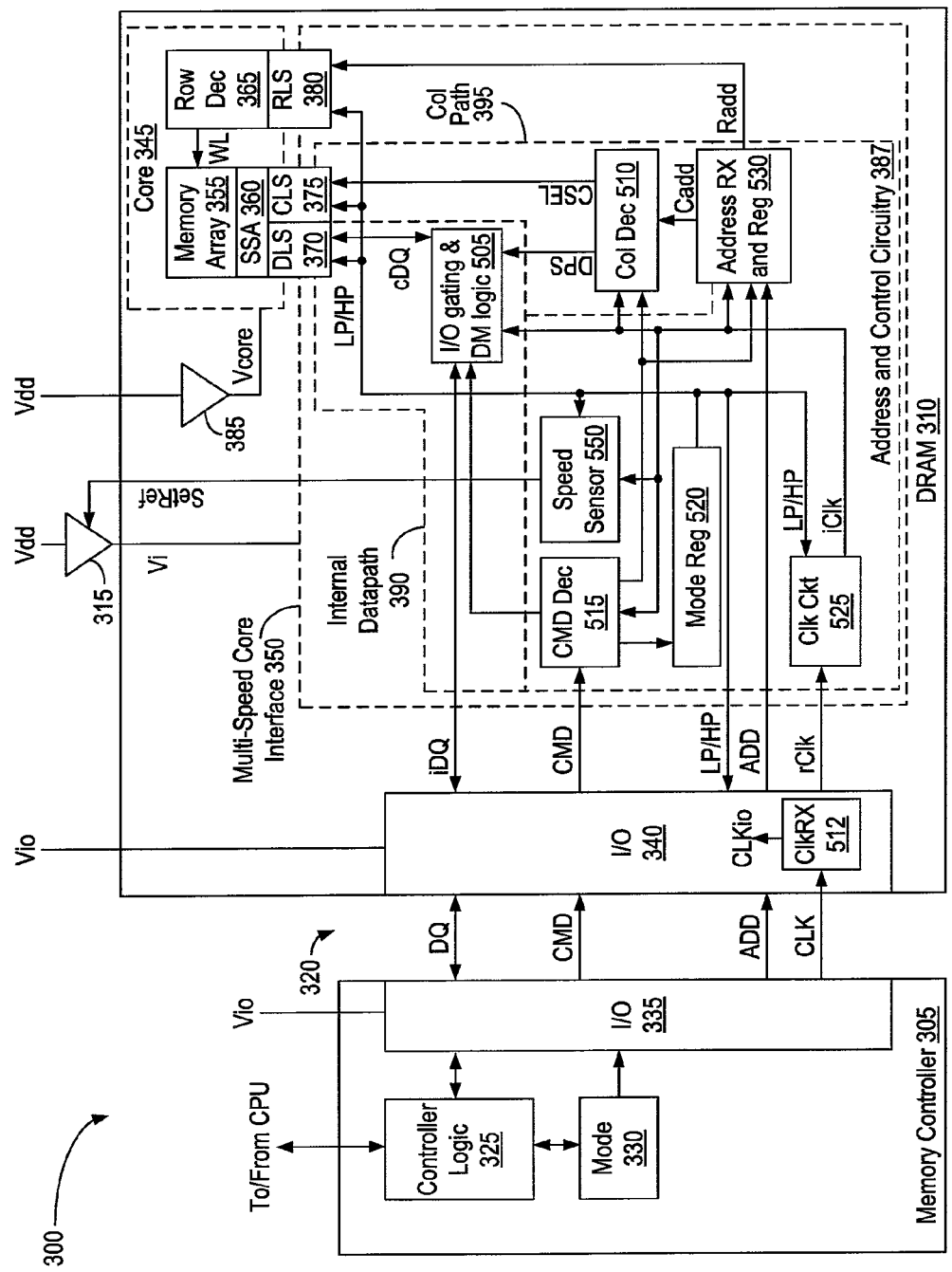
FIG. 5 details portions of memory system 300 omitted for ease of illustration from FIG. 3.

FIG. 5 details portions of memory system 300 omitted for ease of illustration from FIG. 3. As described above, core interface 350 includes an internal datapath 390, address and control circuitry 387, and column path 395. Datapath 390 extends from external interface 340 to data level shifter 370, and includes I/O gating and data-mask logic 505. Column path 395 extends from address and control circuitry 387, and includes a column decoder 510 that converts column address signals Cadd to datapath-select signal to logic 505 and column-select signals CSEL for application to core 345 via level shifter 375. Datapath 390 and column path 395 are functionally conventional but are adapted to accommodate the two supply voltages and data rates used in the respective low-power and high performance modes. External I/O interface 340 includes a clock receiver 512 that uses clock signal CLK from controller 305 to derive both an I/O clock signal CLKio and a reference clock signal rClk. Clock signals CLKio and rClk do not change their frequencies when switching between the low-power and high-performance modes in this embodiment.

Address and control circuitry 387 includes a command decoder 515 that receives and decodes commands CMD from memory controller 305 to direct the flow of address and data signals between memory controller 305 and memory core 345. Command decoder 515 supports numerous conventional functions, and additionally decodes commands that select between the low-power and high-performance modes discussed previously. Responsive to a low-power command, for example, command decoder 515 loads a mode register 520 with a value indicative of that mode. Register 520 thereafter asserts signal LP/HP.

Asserting signal LP/HP readies levels shifters 370, 375, and 380 to shift the data, column-select, and row-address signals to the requisite core voltages as detailed above in connection with FIG. 3. The asserted signal LP/HP also affects a number of circuits within address and control circuitry 387. A clock circuit 525 produces an interface clock signal iClk responsive to reference clock signal rClk. The frequency of interface clock signal iClk varies between the low-power and high-performance modes. In one embodiment, clock signal iClk oscillates at 100 MHz when signal LP/HP is asserted and 200 MHz when signal LP/HP is de-asserted.

The frequency of clock signal iClk controls the signaling rates for an address receiver and register 530, command decoder 515, column decoder 510, and logic 505. Reducing the frequency of clock signal iClk thus reduces the signaling rates through control circuitry 387. Signal LP/HP is fed to I/O interface 340 to configure that interface for the lower signaling rates. Mode register 330 plays a similar role for I/O interface 335 on the controller side. Various options for adapting I/O interfaces 335 and 340 to accommodate multiple signaling rates are detailed below.

Reducing the signaling rates through core interface 350 allows the interface supply voltage Vi to be scaled down to save power. In one embodiment voltage Vi is about 1.2V in the high-performance mode, and is scaled down to about 0.8V in the low-power mode. This reduction reduces the energy per bit in core interface 350 by about 44%.

Command decoder 515 loads register 520 with a different value to change from the low-power to high-performance mode. In that case, register 520 de-asserts signal LP/HP to return clock signal iClk to the higher frequency, and consequently increase the signaling rates through core interface 350. Interface supply voltage Vi is also increased to accommodate the demand for increase signaling rates.

Regulator 315 can be controlled directly by e.g. signal LP/HP to switch between supply voltages for the different modes. In such cases the voltages are sufficiently high to meet worst-case timing constraints. The embodiment of FIG. 5 includes a speed sensor 550 that measures the speed performance of core interface 350 and, based on this measure, adjusts the voltage Vi to a level tailored for each instance of DRAM 310. Because memory devices are often rated based on average worst-case performance, and individually may be capable of better-than-rated performance, the resulting interface voltages Vi can typically be lowered on an individualized basis to an amount below rated minimums, and can consequently save power.

An embodiment of speed sensor 550 is detailed below. Briefly, speed sensor 550 includes delay elements that replicate signal propagation delays through core interface 350, which propagation delays are a function of interface voltage Vi (lower voltages Vi produce longer delays). Speed sensor 550 uses the period of clock signal iClk as a measure of the propagation delay through these delay elements. Using a control signal SetRef to regulator 315, speed sensor adjusts voltage Vi until the propagation delay through the delay elements bears a desired relationship to the period of clock signal iClk. Voltage Vi can be optimized in either or both modes.

Figure 6:
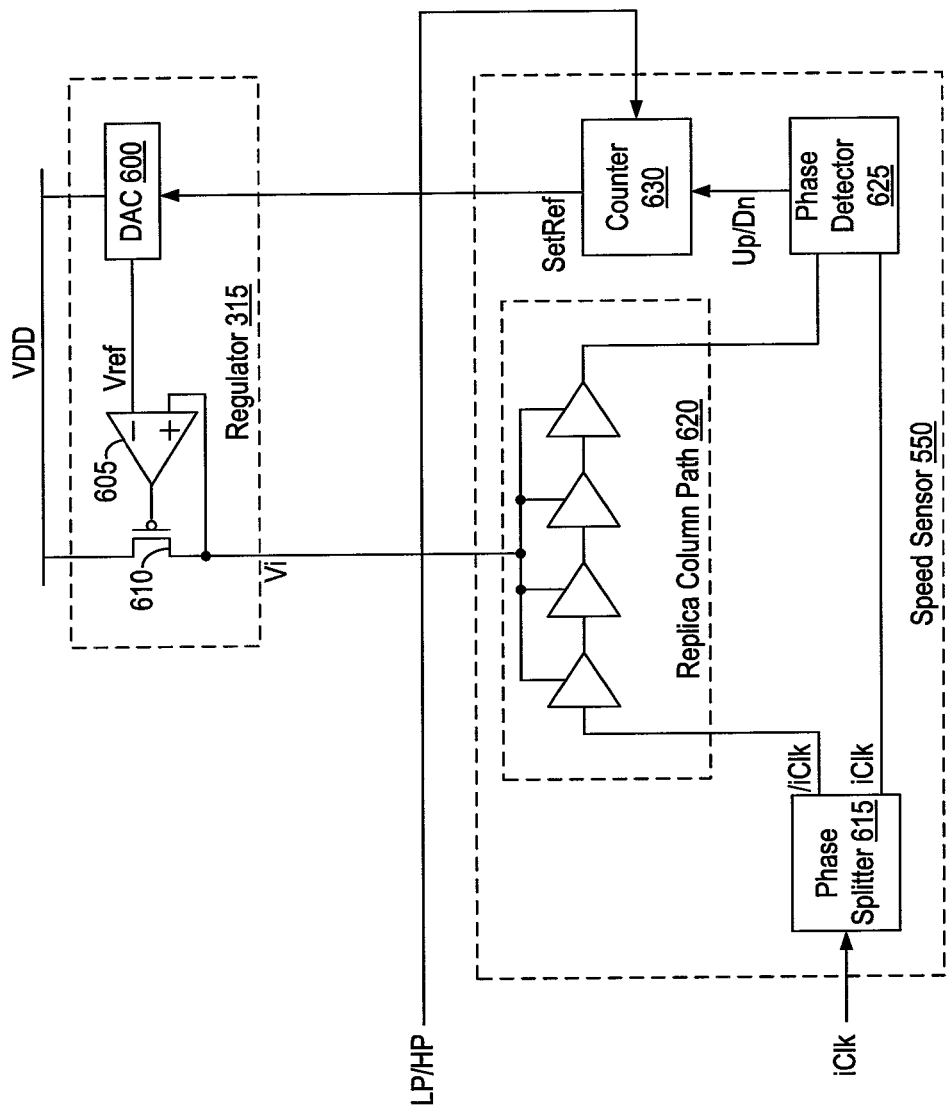
FIG. 6 details embodiments of voltage regulator 315 and speed sensor 550, both of FIG. 5.

FIG. 6 details embodiments of voltage regulator 315 and speed sensor 550, both of FIG. 5. Voltage regulator 315 includes a digital-to-analog converter (DAC) 600, a differential amplifier 605, and a PMOS transistor 610. DAC converts a digital set-reference signal SetRef to an analog voltage Vref. Amplifier 605 compares voltage Vi to voltage Vref to provide an output representative of the difference. The output of amplifier 605 controls the impedance through PMOS transistor 610 to maintain the voltage Vi equal to reference voltage Vref. Voltage Vi is thus maintained at a value determine by digital signal SetRef from speed sensor 550.

Speed sensor 550 includes a phase splitter 615, a replica 620 of all or a portion of column path 395 (FIGS. 3 and 5), a phase detector 625, and a counter 630. Phase splitter 615 splits clock signal iClk into its true and complement forms iClk and /iClk. Replica column path 620 delays the inverted clock signal /iClk, and the resulting delayed waveform is presented with signal iClk to the inputs of phase detector 625. Phase detector 625 asserts a signal Up/Dn to counter 630 if the phase of the delayed, inverted clock signal is late relative to signal iClk, which indicates that the replica column path is too slow. Asserting signal Up/Dn increments counter 630, causing regulator 315 to increase interface supply voltage Vi. Increasing voltage Vi reduces the delay through path 620, and consequently counters the phase difference between the inputs of phase detector 625. Speed sensor 550 reaches equilibrium when the delay through path 620 equals one half of the period of clock signal iClk.

Signal LP/HP is conveyed to counter 630 to make course adjustments to voltage Vi when switching between modes. In other embodiments counter 630 saves the count for the low and high-power modes to speed switching. These counts may be established once, or can be updated periodically. In still other embodiment separate voltage regulators are used to deliver the different interface voltage levels. Either or both of voltage regulator 315 and speed sensor 550 can be adapted to support additional speed modes, or to accommodate power and performance adjustments over a range of speeds and supply voltages.

Figure 7:
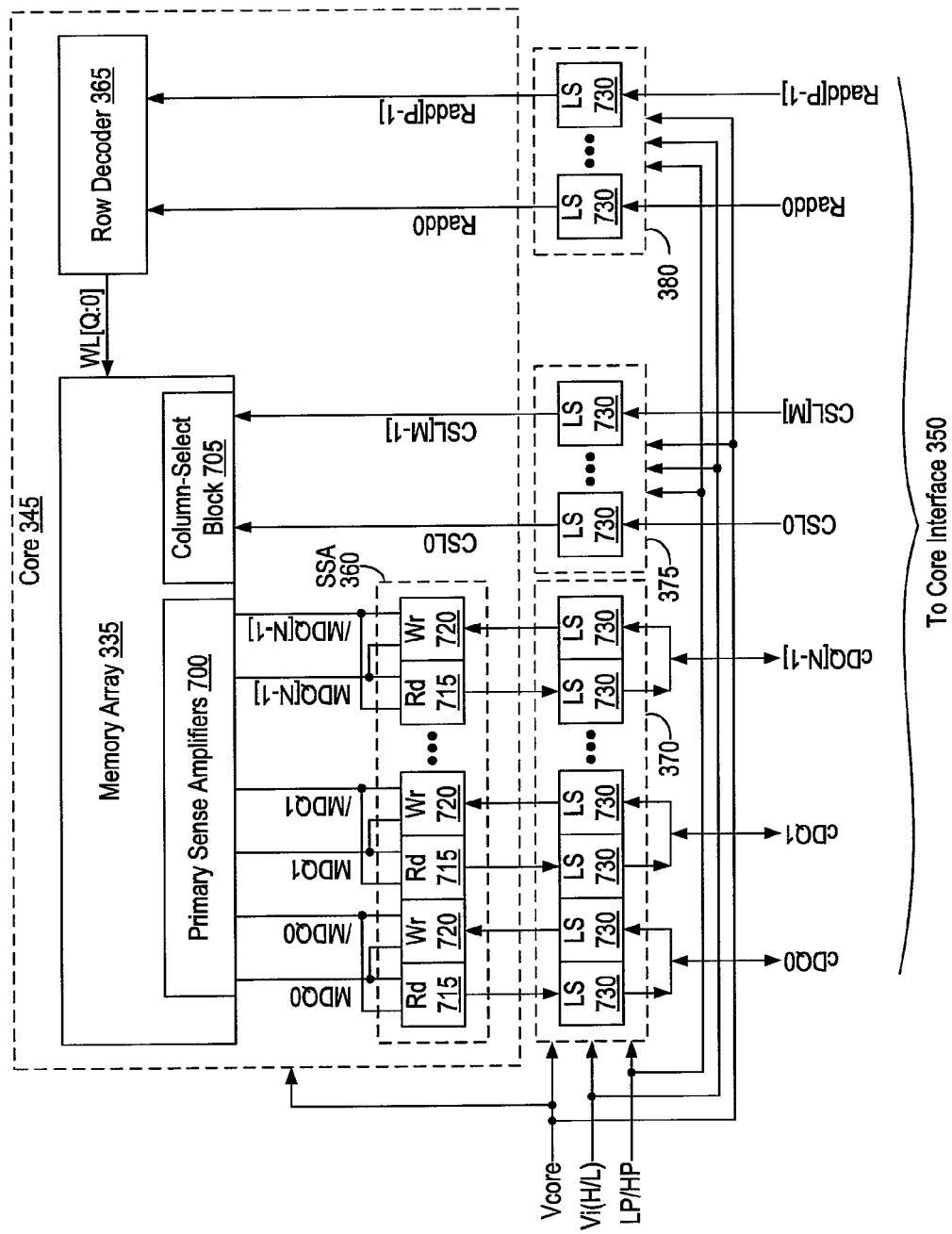
FIG. 7 details portions of core 345 and level shifters 370, 375, and 380 of FIGS. 3 and 5 in accordance with one embodiment.

FIG. 7 details portions of core 345 and level shifters 370, 375, and 380 of FIGS. 3 and 5 in accordance with one embodiment. Core 345 includes memory array 355, which may be one of a number of memory banks. Row decoder 365 connects to and controls rows of memory cells in array 355 via a number of wordlines WL. Row decoder 365 decodes the wordline signals on lines WL from a number of row-address signals Radd conveyed to the decoder by level shifter 380. As with other blocks depicted throughout the Figures, core 345 and decoder 365 include additional well known structures that are omitted for clarity.

Memory array 355 includes a collection of primary sense amplifiers 700 that convey data back and forth between the memory cells (not shown) and secondary sense amplifier 360 as N complementary data signals MDQ/MDQ. Secondary sense amplifiers 360 includes N read circuits 715 and N write circuits 720, a pair for each complementary set of data signals. Memory array 355 additionally includes a column-select block 705 that receives M column-select signals CSL to select from among columns of memory cells within the array.

Each of level shifters 370, 375, and 380 is actually a collection of level shifters 730, one for each signal path between core 345 and core interface 350. Bi-directional level shifters used for core data signals cDQ are implemented using pairs of uni-directional level shifters. Level shifters 730 that convey signals to core 345 up-shift signals as needed to transition from lower interface voltages; level shifters 730 that convey signals to interface 350 from core 345 down-shift signals as needed.

As noted previously, core voltage Vcore may be made up of a number of voltages used in core 345, generally including an external supply voltage VCC, the internal voltage VINT, a boosted wordline voltage VPP, the bitline voltage VBL a half-bitline-voltage VBL/2 as a reference for the bitline sense-amplifiers, and a substrate voltage VBB. Level shifters 370, 375, and 380 shift their respective signals between interface voltage Vi and VCC in this embodiment, and so need not receive the other core voltages.

Figure 8A:
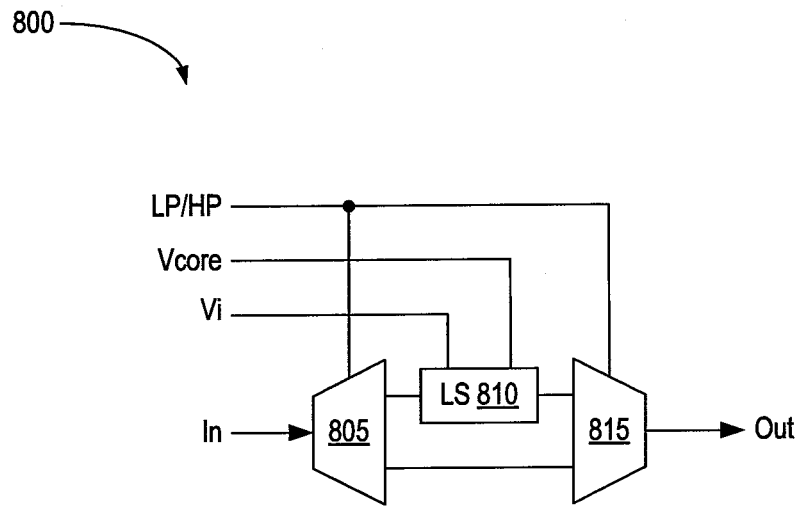
FIGS. 8A and 8B respectively depict selective level shifters 800 and 850 that may be used to implement level shifters 730 of FIG. 7.
Figure 8B:
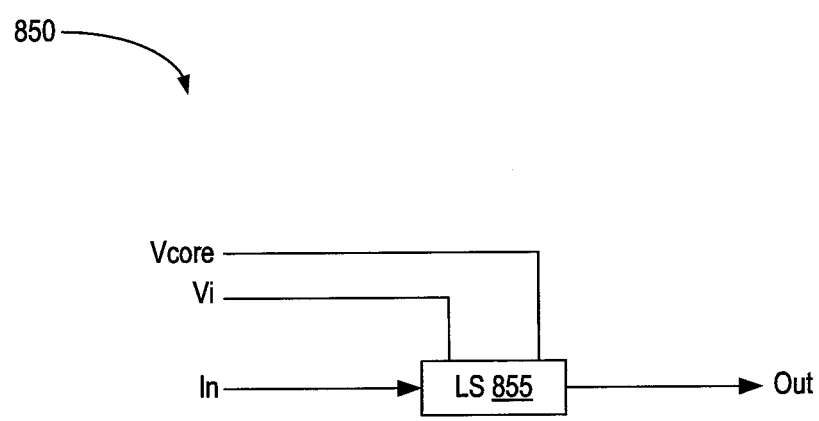

FIGS. 8A and 8B respectively depict level shifters 800 and 850 that may be used to implement level shifters 730 of FIG. 7. Level-shifter 800 includes a demultiplexer 805 that selects from among two paths for an input signal In responsive to mode signal LP/HP. When signal LP/HP is asserted to select the low-power mode, demultiplexer 805 directs input signal In through a level shifter 810, the output of which is selected by a multiplexer 815 responsive to mode signal LP/HP. Level shifter 810 may be an up shifter or a down shifter, depending upon whether the input signal is being applied to or received from the memory core. When signal LP/HP is deasserted to select the high-performance mode, the combination of demultiplexer 805 and multiplexer 815 convey the input signal In to the output Out without a level shift. In other embodiments both paths may be level shifted, though by different amounts depending upon the relative core and interface voltages. Level shifter 855 of FIG. 8B is an up or down shifter designed to operate over a relatively wide range of input or output voltages, and so does not require signal LP/HP as an input.

Returning to FIG. 5, core interface 350 operates at different signaling rates in the two modes. External I/O interfaces 335 and 340 are therefore adapted to accommodate these changes. In one embodiment, the I/O interfaces are slowed in the low-power mode in the same manner as the core interface. High-performance I/O interfaces often include circuitry that cannot quickly adapt to changes in supply voltage and frequency, however, in which case the delays imposed when switching between modes may outweigh the benefits of power savings. In the embodiment of FIG. 5, for example, clock receiver 512 within I/O interface 340 may include a phase-locked loop (PLL) or delay-locked loop (DLL) to maintain a stable phase relationship between clock signal CLKio and data DQ. PLLs and DLLs require time to acquire phase alignment, and this delay may slow mode switching too an undesirable extent. I/O interfaces 335 and 340 may therefore be adapted to operate at the same supply voltage and signaling rates in low-power and high-performance modes.

FIG. 9A-9D are timing diagrams illustrating read and write timing for I/O interface 340 of FIGS. 3 and 5 in both the low-power and the high-performance modes. The data rates and supply voltage Vio do not change, so I/O interface 340 has excess bandwidth in the low-power mode. Bandwidth is reduced by inserting gaps in the command CMI) and data DQ signals in this embodiment.

Figure 9A:
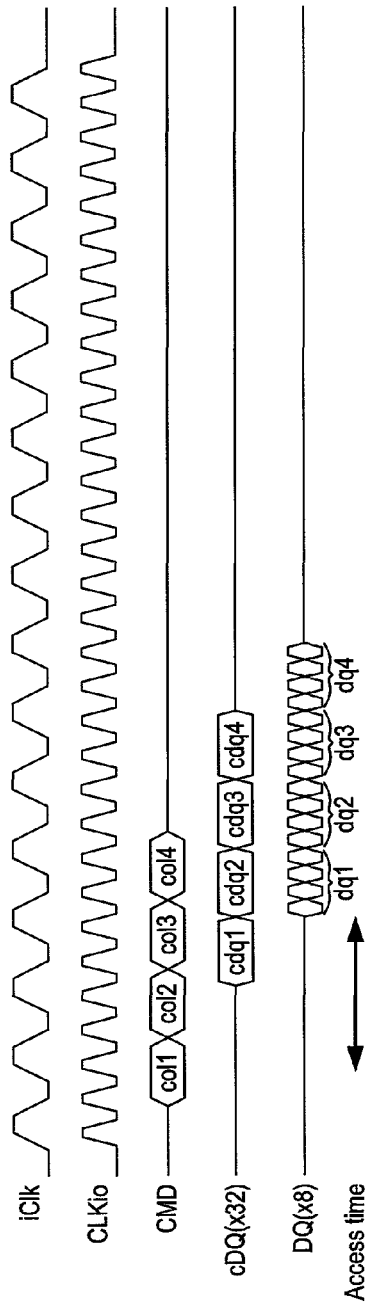

FIG. 9A illustrates the behavior of I/O interface 340 and core interface 350 in the high-performance mode, in which interface clock signal iClk is half the frequency of I/O clock CLKio. In this example, data DQ is conveyed over eight parallel links on both rising and falling edges of clock signal CLKio. Each group of data dq# therefore represents thirty-two bits of information. Core data cDQ is conveyed over thirty-two links on rising edges of interface clock signal iClk, so each group of core data cdq# also represents thirty-two bits. I/O 340 includes serializers and deserializers (not shown) to accommodate the requisite data-width conversions.

In this read example, I/O interface 340 receives a stream of four commands col1, col2, col3, and col4; each of which returns a respective group of thirty-two parallel core data bits cdq1, cdq2, cdq3, and cdq4. I/O interface 340 serializes this core data and transmits it to controller 305 as groups of serialized data dq1, dq2, dq3, and dq4. The data access time, measured between the start of a command and receipt of the corresponding serialized data, is about five periods of clock signal CLKio.

Figure 9B:
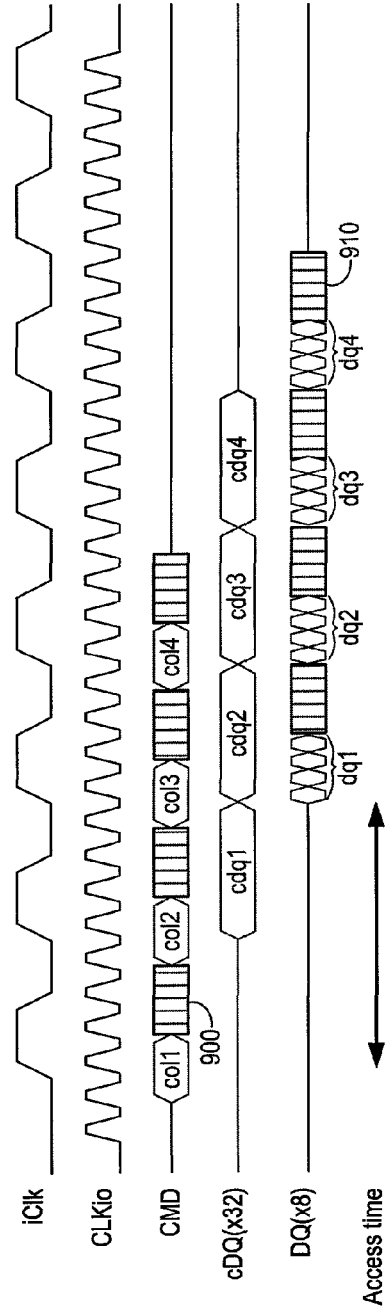

FIG. 9B illustrates the behavior of I/O interface 340 and core interface 350 in the low-power mode, in which interface clock signal iClk is one quarter the frequency of I/O clock CLKio. As in the example of FIG. 9A, data DQ is still conveyed on rising and falling edges of clock signal CLKio and commands CMD are conveyed at a quarter of this rate. Core interface 350 operates at half speed, however, so core data cDQ takes twice as long to reach I/O interface 340. I/O interface 335 at controller 305 inserts gaps 900 between commands to reduce the command bandwidth by a factor of two, thereby allowing core interface 350 time to retrieve the data. I/O interface 340 likewise inserts gaps 910 between bursts of data to halve the data bandwidth. The data access time is double that of the embodiment of FIG. 9A. Gaps 900 and 910 need not be wasted, but can instead be used e.g. by other devices sharing the same bus or to provide forward or back channels in support of dynamic calibration. Thus, the overall command bandwidth of channel 320 is unchanged, but the command bandwidth is halved from the perspective of core interface 350.

FIG. 9C illustrates the behavior of I/O interface 340 and core interface 350 performing a write operation in the high-performance mode. As in the read case, data DQ is conveyed on rising and falling edges of clock signal CLKio, and commands CMD are conveyed at a quarter of this rate. In this example, I/O interface 340 receives a stream of four commands col1, col2, col3, and col4 and corresponding sets of data symbols dq1, dq2, dq3, and dq4. I/O interface 340 de-serializes data DQ to produce four successive sets of parallel core-data symbols cdq1, cdq2, cdq3, and cdq4 that are conveyed to core 345 on a set of thirty-two parallel paths, collectively shown as cDQ in FIG. 5. The write recovery time, specified as the number of cycles of signal CLKio that must elapse after completion of a write operation before the memory cells in core 345 can be precharged, is about eight.

FIG. 9D illustrates the behavior of I/O interface 340 and core interface 350 performing a write operation in the low-power mode, in which interface clock signal iClk is one quarter the frequency of I/O clock CLKio. Core interface 350 operates at half speed relative to the example of FIG. 9C, so core data cDQ takes twice as long to reach I/O interface 340. I/O interface 335 at controller 305 then inserts gaps 920 between commands to allow core interface 350 time to write to the core. I/O interface 340 likewise inserts gaps 930 between bursts of data to halve the data bandwidth. The write recovery time is about double that of the high-performance mode.

Figure 10A:
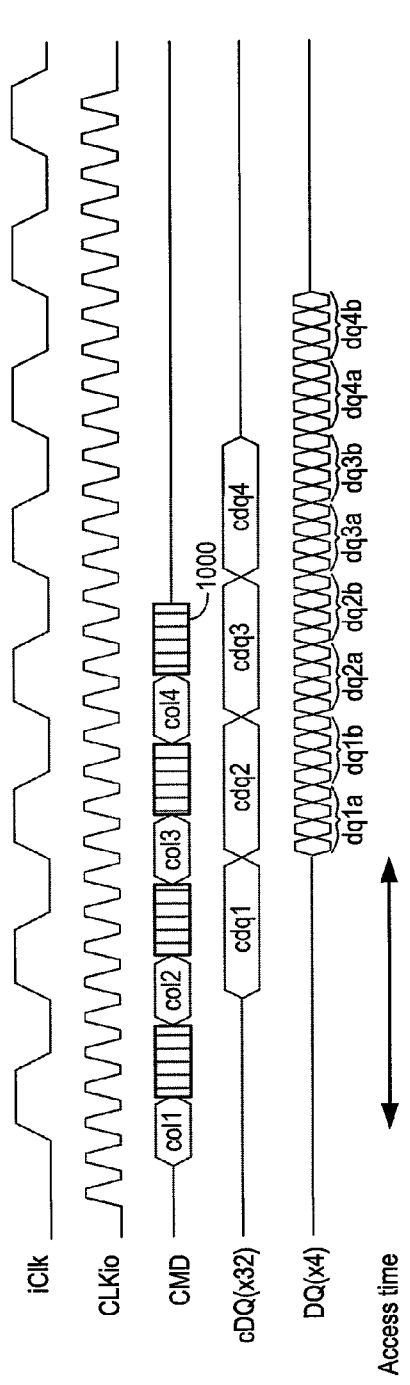
FIGS. 10A and 10B illustrate the behavior of I/O interface 340 and core interface 350 in which I/O interface halves the data rate in the low-power mode by dividing the width of external interface DQ by two.
Figure 10B:
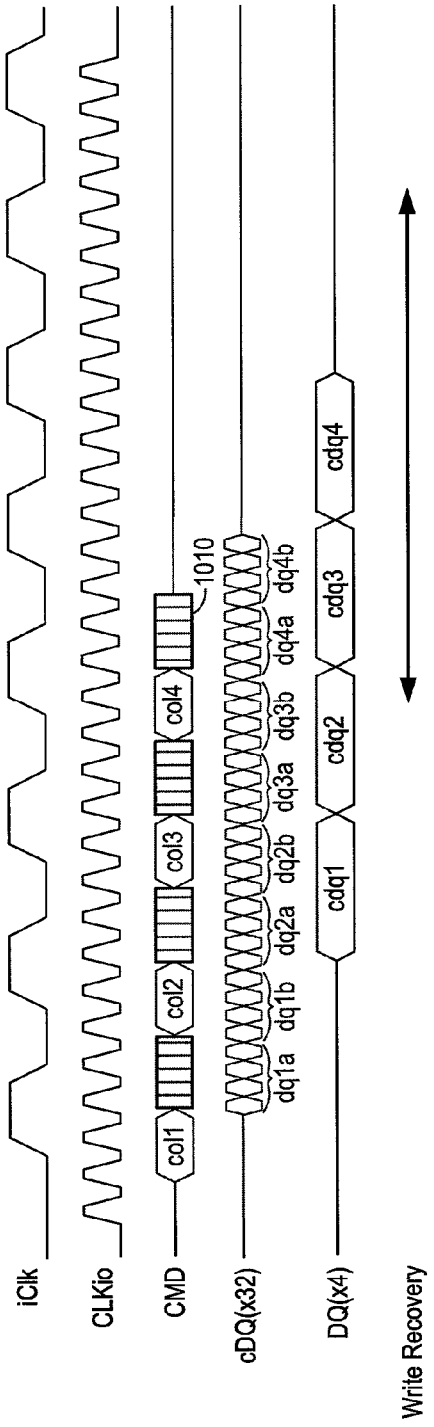

FIGS. 10A and 10B illustrate the behavior of I/O interface 340 and core interface 350 in which the I/O interfaces halve the data bandwidth in the low-power mode by dividing the width of external interface DQ by two. Assuming, for example, that interface DQ includes eight parallel traces, I/O interfaces 335 and 340 can be configured to convey data over all of them in the high-performance mode or half of them in the low-power mode. The data bandwidth is therefore halved from the perspective of core interface 350. The overall bandwidth of interface DQ is unchanged, however, as the bandwidth provided by the unused traces can be used for other purposes.

The variable-width embodiment illustrated in connection with FIGS. 10A and 10B behaves as shown in FIGS. 9A and 9C in the high-performance mode. The read case of FIG. 10A is similar to that of FIG. 9B from a command CMD perspective. I/O interface 335 at controller 305 inserts gaps 1000 between commands to allow core interface 350 time to retrieve the data. Rather than insert gaps into the data channel DQ, however, the data width is halved, from eight to four in this case. Each read command therefore elicits two half-width collections of data rather than one full-width group. Column access col1, for example, elicits data dq1a and dq1b of width four rather than data dq1 of width eight in FIG. 9B. The write case of FIG. 10B is similar to that of FIG. 9D. Gaps 1010 are inserted between commands. Half-width data DQ(×4) is conveyed between I/O interfaces 335 and 340 to accommodate the slower data rate of core interface 350.

FIGS. 11A and 11B illustrate the behavior of I/O and core interfaces for embodiments in which the clock speed and supply voltage Vio of the I/O interfaces are reduced in the low-power mode to accommodate the lower speed of the core interface. Read and write operations in the high-performance mode may be as shown in FIGS. 9A and 9C, respectively. Read and write operations in the low-power mode are performed as shown in FIGS. 11A and 11B. Namely, the frequencies of clocks iClk and CLKio are both halved to halve the signaling rates of the core and I/O interfaces, respectively. Voltages Vio to the I/O interfaces of the controller, the memory device, or both can be reduced in the low-power mode for increased power savings.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Similarly, signals described or depicted as having active-high or active-low logic levels may have opposite logic levels in alternative embodiments.

As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). In any case, whether a given signal is an active low or an active high will be evident to those of skill in the art.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments are also envisioned. For example, as mentioned earlier, a memory controller can program a voltage regulator (either internal to a memory device or external to a memory device) on a dynamic basis to achieve desired goals, e.g., to vary settings outside of formally defined modes; separate registers for interface power and frequency and other settings may be provided for this purpose. Other designs also exist. These examples are in no way exhaustive, as many alternatives within the scope of the claims will be obvious to those of ordinary skill in the art. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. For U.S. applications, only those claims specifically reciting "means for" or "step for" should be construed in the manner required under the sixth paragraph of 35 U.S.C. §112.

What is claimed is:

1. A method of reading data from a memory core of an integrated memory device in alternative low-power and high-performance modes, the method comprising:
   in one of the modes, communicating first data from the memory core at a first signaling voltage, level shifting the first data to a second signaling voltage, and communicating the level-shifted first data at a first data rate; and
   in the other of the modes, communicating second data from the memory core at the first signaling voltage, and communicating the second data at a third signaling voltage different from the second signaling voltage and at a second data rate different from the first data rate.

2. The method of claim 1, further comprising level shifting the second data to the third signaling voltage and communicating the level-shifted second data to an external data interface at the second data rate.

3. The method of claim 1, further comprising receiving a command to switch between the high-performance and low-power modes.

4. The method of claim 1, further comprising communicating the second data via a data path, measuring a speed of the datapath, and adjusting the second signaling voltage responsive to the speed.

5. The method of claim 1, wherein the memory device communicates the first data responsive to a read command specifying a read address, the method further comprising decoding the read address and level shifting the decoded read address.

6. The method of claim 1, further comprising transmitting the first data from the memory device at a third data rate in the high-performance mode.

7. The method of claim 6, further comprising communicating the second data from the memory device at the third data rate in the low-power mode.

8. The method of claim 6, further comprising communicating the second data from the memory device at a fourth data rate in the low-power mode.

9. The method of claim 1, further comprising communicating the first data from the memory device at a first data width and communicating the second data from the memory device at a second data width.

10. The method of claim 1, further comprising inserting gaps in the first data and communicating the first data from the memory device at a third data rate.

11. A memory device to support a first mode and a second mode, the memory device comprising:
    a memory core to store and convey core data signals at a core-data voltage;
    a level shifter coupled to the memory core to level shift the core data signals from the core-data voltage to a first datapath voltage in the first mode and to convey the core data signals using a second datapath voltage different from the first datapath voltage in the second mode; and
    a datapath coupled to the level shifter to convey the level-shifted core data signals at a first data rate in the first mode and at a second data rate different from the first data rate in the second mode.

12. The memory device of claim 11, wherein the level shifter level shifts the core data signals from the core-data voltage to the second datapath voltage in the second mode.

13. The memory device of claim 12, further comprising an adjustable voltage regulator to provide the first and second datapath voltages.

14. The memory device of claim 11, wherein the datapath conveys the core data signals at the core-data voltage in the second mode.

15. The memory device of claim 11, further comprising a clock node to receive a clock signal having a first clock frequency in the first mode and a second clock frequency in the second mode.

16. The memory device of claim 15, further comprising a speed sensor coupled to the clock node to receive the clock signal, the speed sensor to select the datapath voltage in the first mode.

17. The memory device of claim 16, wherein the speed sensor selects a second datapath voltage in the second mode.

18. A memory device comprising:
device input/output (I/O) circuitry to communicate commands and data;
a core interface coupled to the I/O circuitry to interpret the commands, the core interface directing the data at respective first and second data rates;
a memory core coupled to the core interface to store and deliver the data;
a first supply node connected to the core interface to deliver first and second supply voltages in the respective first and second modes; and
a second supply node connected to the memory core to deliver a third supply voltage in the first and second modes.

19. The memory device of claim 18, further comprising a level shifter coupled between the core interface and the memory core, the level shifter to level shift the data between the first and third supply voltages in the first mode and between the second and third supply voltages in the second mode.

20. The memory device of claim 19, the level shifter including a mode input to receive a mode signal that distinguishes between the first and second data rates.

21. The memory device of claim 18, wherein the core interface includes a mode register to store a mode value selecting one of the first and second modes.

22. The memory of claim 21, wherein the core interface further includes a command decoder coupled to the mode register to load the mode value responsive to one of the commands.

23. The device of claim 18, wherein the memory core includes a row decoder coupled to the core interface to receive row addresses.

24. The device of claim 23, further comprising a level shifter bridging the row decoder and the core interface, the level shifter to level shift the row addresses from the first supply voltage to the third supply voltage and from the second supply voltage to the third supply voltage.

25. The device of claim 18, wherein the one of the first and second voltages equals the third voltage.

26. The device of claim 18, wherein the core interface includes a clock circuit to generate a first clock signal to time the first data rate and a second clock signal to time the second data rate.

27. The device of claim 26, wherein the core interface includes a datapath coupled to the clock circuit to receive the first and second clock signals, the datapath to communicate the data between the device I/O circuitry and the memory core at the first and second data rates.

28. The device of claim 18, further comprising a speed sensor coupled to the first supply node, the speed sensor to adjust the first supply voltage responsive to a speed measure of the data and control circuitry.

29. The device of claim 28, wherein the speed sensor includes a replica of a portion of the core interface, the replica to replicate a signal-propagation delay through the core interface.

* * * * *